(12) United States Patent
Mandelman et al.

(10) Patent No.: US 7,906,390 B2
(45) Date of Patent: Mar. 15, 2011

(54) THIN GATE ELECTRODE CMOS DEVICES AND METHODS OF FABRICATING SAME

(75) Inventors: Jack A. Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 11/780,519

(22) Filed: Jul. 20, 2007

(65) Prior Publication Data

US 2009/0020827 A1    Jan. 22, 2009

(51) Int. Cl.
*H01L 21/8238* (2006.01)

(52) U.S. Cl. ........... 438/233; 257/377; 257/E21.632; 257/E29.255

(58) Field of Classification Search .......... 257/347, 257/369, 377, E21.632, E29.255; 438/270, 438/289, 233
See application file for complete search history.

(56) References Cited

U.S. PATENT DOCUMENTS

| 2002/0076885 | A1* | 6/2002 | Chen | 438/270 |
| 2003/0143810 | A1* | 7/2003 | Kuroi et al. | 438/289 |
| 2004/0137688 | A1* | 7/2004 | Chang et al. | 438/303 |
| 2005/0051854 | A1* | 3/2005 | Cabral et al. | 257/407 |
| 2007/0190728 | A1* | 8/2007 | Sreekantham et al. | 438/270 |
| 2008/0157212 | A1* | 7/2008 | Lavoie et al. | 257/369 |
| 2008/0265322 | A1* | 10/2008 | Lin et al. | 257/347 |

* cited by examiner

*Primary Examiner* — Thao X Le
*Assistant Examiner* — Marvin Payen
(74) *Attorney, Agent, or Firm* — Schmeiser, Olsen & Watts; David Cain (57) ABSTRACT

A CMOS device and method of forming the CMOS device. The device including a source and a drain formed in a semiconductor substrate, the source and the drain and separated by a channel region of the substrate; a gate dielectric formed on a top surface of the substrate and a very thin metal or metal alloy gate electrode formed on a top surface of the gate dielectric layer, a polysilicon line abutting and in electrical contact with the gate electrode, the polysilicon line thicker than the gate electrode. The method including, forming the gate electrode by forming a trench above the channel region and depositing metal into the trench.

15 Claims, 12 Drawing Sheets

THIN GATE ELECTRODE CMOS DEVICES AND METHODS OF FABRICATING SAME

FIELD OF THE INVENTION

The present invention relates to the field of complimentary metal-oxide-silicon (CMOS) transistors; more specifically, it relates to CMOS transistors having thin gate electrodes and methods of fabricating thin gate electrode CMOS transistors.

BACKGROUND OF THE INVENTION

With the continuing downward scaling of CMOS technology, the parasitic capacitance between conventionally scaled gate electrodes and the source/drains of the same device and between conventionally scaled gate electrodes and the physical contact structures to the source/drains of the same device does not scale with decreasing dimensions of the devices. Accordingly, there exists a need in the art to overcome the deficiencies and limitations described hereinabove.

SUMMARY OF THE INVENTION

A first aspect of the present invention is a structure, comprising: a source and a drain formed in a device region of a semiconductor substrate, the source and the drain separated by a channel region in the device region; a gate dielectric layer formed on a top surface of the substrate in the channel region and a metal or metal alloy gate electrode formed on a top surface of the gate dielectric layer, the gate electrode having sidewalls and a top surface; and a polysilicon line abutting and in electrical contact with at least one sidewall of the gate electrode, the polysilicon line having a first thickness in a direction perpendicular to a top surface of the substrate greater than a second thickness in the direction perpendicular to the top surface of the substrate of the gate electrode.

A second aspect of the present invention is a structure, comprising: a source and a drain formed in a device region of a semiconductor substrate, the source and the drain separated by a channel region in the device region; a gate dielectric formed on a top surface of the substrate in the channel region and a metal or metal alloy gate electrode formed on a top surface of the gate dielectric layer; and wherein the gate electrode has a thickness of less than about 25 nm.

A third aspect of the present invention is a method, comprising: (a) forming a dielectric trench isolation in a semiconductor substrate; (b) forming a first layer on a top surface of the semiconductor substrate; (c) patterning the first layer into a line, the line extending over the channel region and the trench isolation; (d) forming dielectric spacers on opposite sidewalls of the line, the spacers having inner walls abutting the line and outer walls away from the line; (e) forming a source and a drain separated by a channel region in the substrate where the substrate is not protected by the line or the spacers; (f) forming a second layer over the source, the drain and the trench isolation and the spacers; (h) removing the line from over the channel region to form a trench defined by the inner walls of the spacers and the top surface of the substrate; (i) forming a gate dielectric layer on the top surface of the substrate in the channel region; and (j) forming a metal or metal alloy gate electrode on a top surface of the gate dielectric layer, the gate electrode extending over the trench isolation, the gate electrode and the gate dielectric layer not filling the trench.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The present invention utilizes a very thin gate electrode (e.g. gate electrodes having a thickness divided by width over the channel region ratio smaller than found on conventional devices.) This width of the gate electrode is measured in the channel length direction of the device (i.e. in direction perpendicular to the source, from source to drain). The thinner gate electrode significantly reduces the parasitic capacitance of the device. For example, using finite-element modeling, a 73% reduction in parasitic capacitance is predicted when the gate electrode thickness is reduced from 100 nm to 10 nm in otherwise identical CMOS devices. The rate of increase in parasitic capacitance from a gate electrode thicknesses from about 1 nm to about 25 nm is less than half the rate of the increase in parasitic capacitance from a gate electrode thicknesses from about 25 nm to about 100 nm. Therefore, it is critical to have the gate electrode as thin as possible over the channel region of the CMOS devices in order to reduce parasitic capacitance. The use of metal or electronically conductive metal silicides is also critical to reducing the resistance of such thin gate electrodes.

Figure 1A:
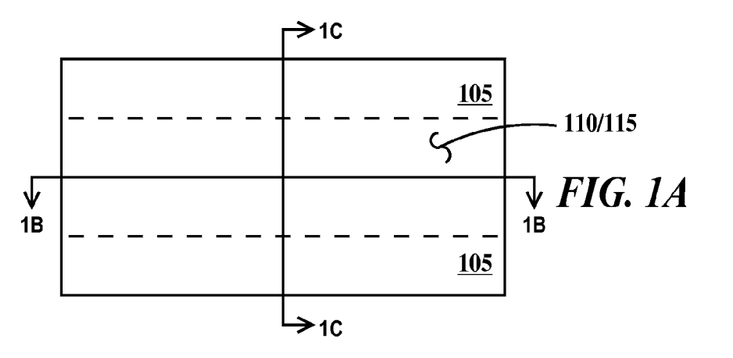
FIGS. 1A/1B/1C through 10A/10B/10C are respectively top views, and front and side cross-sectional views through respective lines 1B-1B and 1C-1C through 10B-10B and 10C-10C illustrating fabrication of a CMOS device according to a first embodiment of the present invention.

FIGS. 1A/1B/1C through 10A/10B/10C are respectively top views, and front and side cross-sectional views through respective lines 1B-1B and 1C-1C through 10B-10B and 10C-10C illustrating fabrication of a CMOS device according to a first embodiment of the present invention.

Figure 1B:
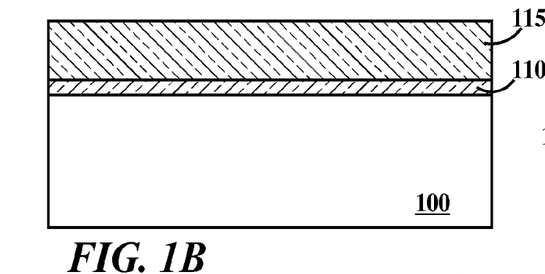
Figure 1C:
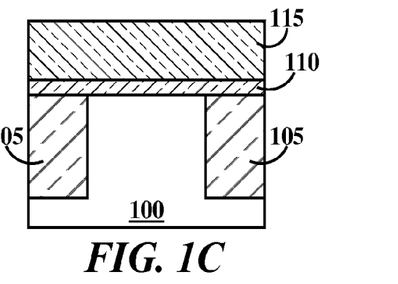

FIG. 1A is a top view, FIG. 1B is a cross-sectional view through line 1B-1B of FIG. 1A and FIG. 1C is a cross-sectional views through line 1C-1C of FIG. 1A. In FIGS. 1A, 1B and 1C, formed in a substrate 100 is a shallow trench isolation (STI) 105. A top surface of substrate 100 and a top surface of STI 105 are coplanar. Formed on the top surface of substrate 100 and STI 105 is a first pad layer 110. A second pad layer 115 is formed on a top surface of the first pad layer. In one example, substrate 100 comprises single-crystal silicon. In one example, STI 105 comprises silicon dioxide. In one example, first pad layer 110 comprises silicon dioxide. In one example, second pad layer 115 comprises silicon nitride.

Figure 2A:
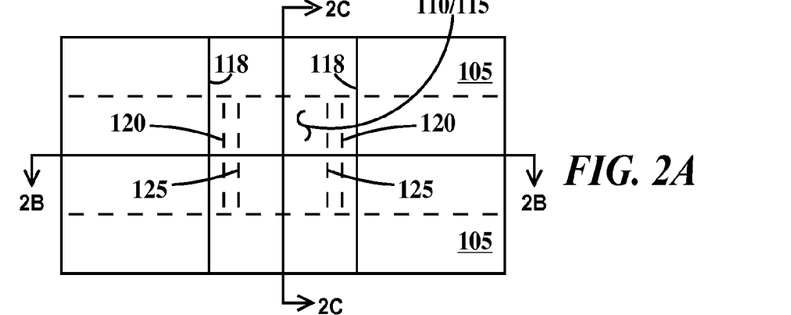
Figure 2B:
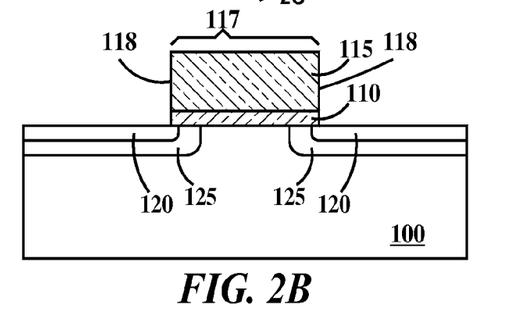
Figure 2C:
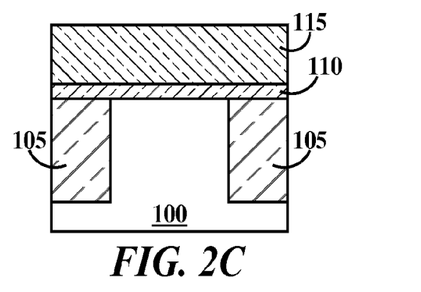

FIG. 2A is a top view, FIG. 2B is a cross-sectional view through line 2B-2B of FIG. 2A and FIG. 2C is a cross-sectional views through line 2C-2C of FIG. 2A. In FIGS. 2A, 2B and 2C, first and second pad layers are patterned into a stripe 117 running perpendicular to STI 105. Patterning of first and second pad layers 110 and 115 may be accomplished, for example, by forming a photolithographically defined photoresist mask or a hard mask (a layer formed by transferring a photoresist mask into a dielectric layer) followed by a reactive ion etch (RIE) and then removal of the photoresist mask or hard mask. Then a source/drain extension region 120 a source/drain halo region 125 are formed in substrate 100, both extending under stripe 117. In one example source/drain extension region 120 and source/drain halo region 125 are independently formed by ion implantation of dopant species, the dopant species being blocked by stripe 117 from penetrating into the substrate under stripe 117, except along edges 118 of stripe 117. An activation anneal (heating substrate 100 above room temperature) activates the dopant species and drives the dopant species further under edges 118 of stripe 117. Activation anneals, drive dopants from interstitial positions to lattice position in substrate 100. Examples of annealing processes include but are not limited to conventional oven annealing, laser spike annealing and rapid thermal annealing.

Figure 3A:
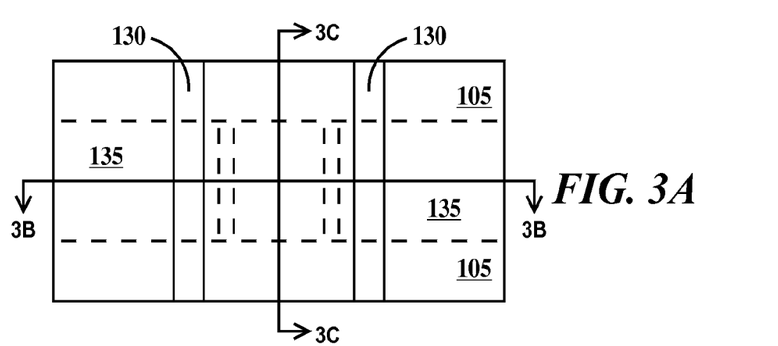
Figure 3B:
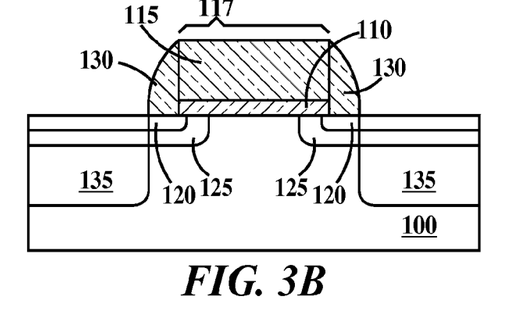
Figure 3C:
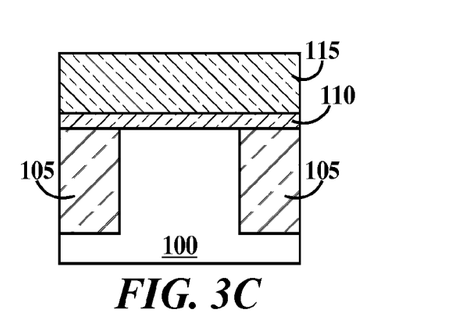

FIG. 3A is a top view, FIG. 3B is a cross-sectional view through line 3B-3B of FIG. 3A and FIG. 3C is a cross-sectional views through line 3C-3C of FIG. 3A. In FIGS. 3A, 3B and 3C, spacers 130 are formed on the sidewalls of stripe 117. Spacers 130 may be formed by deposition (e.g. chemical vapor deposition, CVD) of a conformal layer followed by an RIE etch. In one example, spacers 130 comprise silicon dioxide. Next bulk source/drain regions 135 are formed in silicon substrate 100 by, for example ion implantation. Again an activation anneal is performed.

Figure 4A:
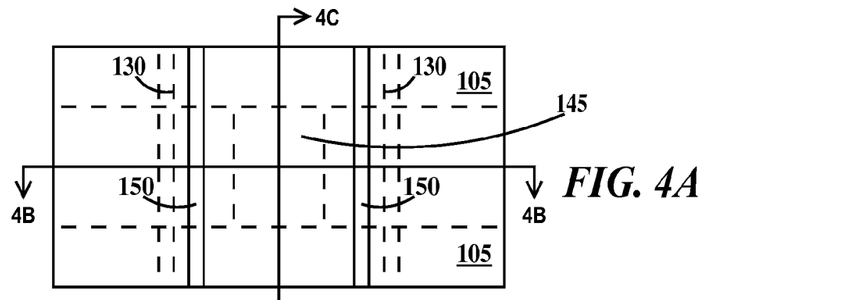
Figure 4B:
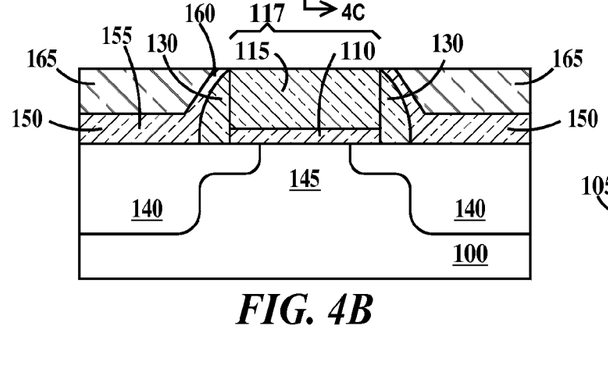
Figure 4C:
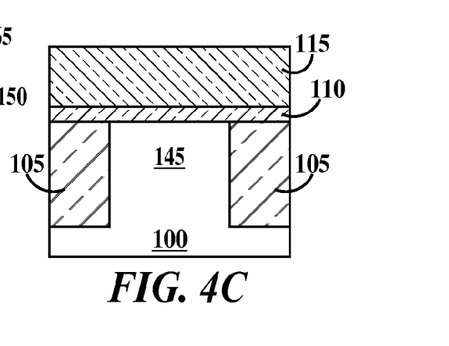

FIG. 4A is a top view, FIG. 4B is a cross-sectional view through line 4B-4B of FIG. 4A and FIG. 4C is a cross-sectional views through line 4C-4C of FIG. 4A. In FIGS. 4A, 4B and 4C, the halo, extension and bulk source/drain regions 125, 120 and 135 are represent by source/drains 140 of FIGS. 3A, 3B and 3C, are represent by source drains 140 and a region of substrate 100 under stripe 117 between source/drains 140 as a channel region 145. A layer of high density plasma (HDP) silicon nitride layer 150 is then blanket deposited forming thick regions on horizontal surfaces such as source/drains 140 and any exposed STI 105 and thin regions 160 on vertical surfaces such as on spacers 130. Then a blanket CVD deposition of silicon dioxide layer 165 is performed followed by a chemical-mechanical-polish (CMP) or other planarizing process to expose the top surface of silicon nitride layer 115 and to coplanarize the top surface of silicon nitride layer 115 (optionally a top surface of silicon nitride layer 150) and a top surface of silicon oxide layer 165. While in FIG. 4B, a top surface of a band of silicon nitride layer 150 is exposed between the top surface of silicon nitride layer 115 and the top surface of silicon oxide layer 165, silicon nitride layer may be completely covered by silicon dioxide layer 165.

At this point, substantially all high temperature process (e.g. process of greater than about 500° C.) have been performed, so high-K (dielectric constant) gate dielectrics, if desired, may be formed without concern for subsequent heat generated degradation of the gate dielectric. A high K dielectric material has a relative permittivity above about 10. Examples of high-K materials include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof.

Figure 5A:
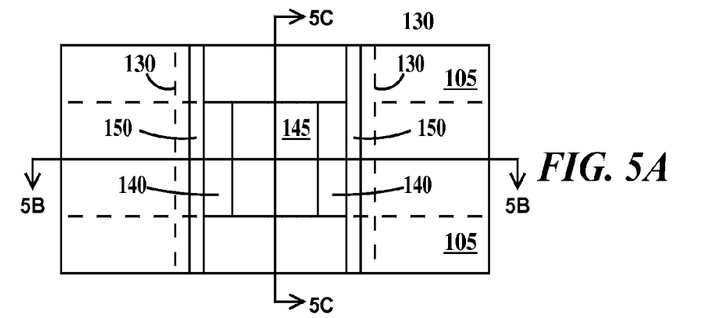
Figure 5B:
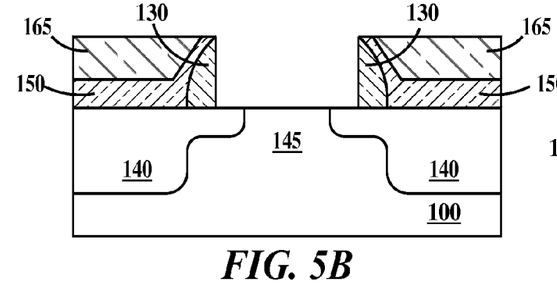
Figure 5C:
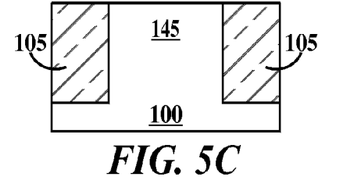

FIG. 5A is a top view, FIG. 5B is a cross-sectional view through line 5B-5B of FIG. 5A and FIG. 5C is a cross-sectional views through line 5C-5C of FIG. 5A. In FIGS. 5A, 5B and 5C, first and second pad layer 110 and 115 are removed (see FIGS. 4A, 4B and 4C), for example by wet or dry etching.

Figure 6A:
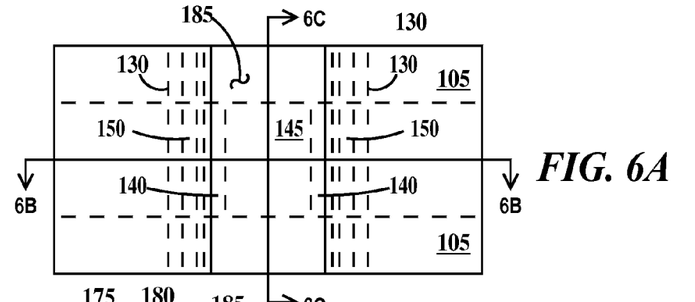
Figures 6B, 6C:
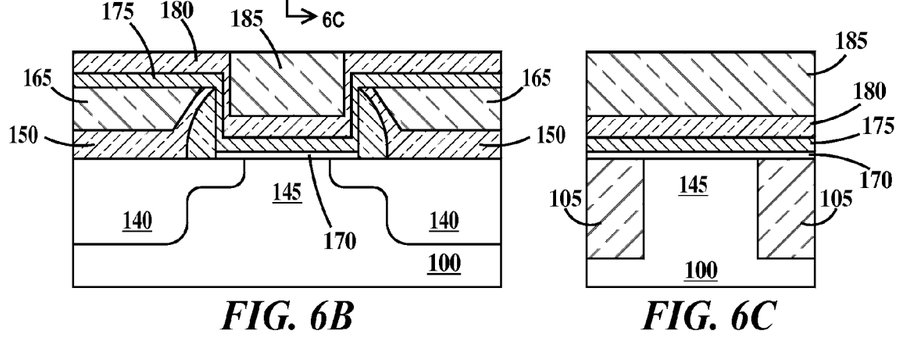

FIG. 6A is a top view, FIG. 6B is a cross-sectional view through line 6B-6B of FIG. 6A and FIG. 6C is a cross-sectional views through line 6C-6C of FIG. 6A. In FIGS. 6A, 6B and 6C, the surface of substrate 100 exposed in FIGS. 5A, 5B and 5C is cleaned and a gate dielectric layer 170 is formed. Gate dielectric layer 170 may comprise deposited or thermally grown silicon dioxide, silicon oxynitride, silicon nitride, a high-K dielectric, or combinations of layers thereof.

Next a blanket gate conductor layer 175, preferably a metal, is formed. In one example, gate conductor layer is formed by a collimated or a directional deposition method, such that the conductor forms substantially thicker on horizontal surfaces (i.e. those surfaces parallel to the top surface of substrate 100) than the conductor forms on vertical surfaces (i.e. those surfaces perpendicular to the top surface of substrate 100). In one example the thickness of gate conductor layer 175 on horizontal surfaces is between about 5 nm and about 25 nm. In one example the thickness of gate conductor layer 175 on horizontal surfaces is less than about 25 nm. The material of gate conductor layer 175 is selected such that it provides the desired work function for the device of interest. For example, metals such as tungsten, titanium, tantalum, or aluminum, or electrically conductive metallic nitrides or silicides, doped or undoped, may be used. Different gate conductor materials may be used for p-channel field effect transistors (PFETs) and n-channel field effect transistors (NFETs).

Next a blanket HDP silicon nitride layer 180 is formed over gate conductor layer 175. Once again, silicon nitride layer 180 is substantially thicker on horizontal surfaces than on vertical surfaces. In one example the thickness of silicon nitride layer 180 on horizontal surfaces is between about 10 nm and about 35 nm.

Next a silicon oxide layer 185 is deposited (e.g. by CVD) and a CMP performed to coplanarize a top surface of silicon nitride layer 180 and silicon oxide layer 185.

Figure 7A:
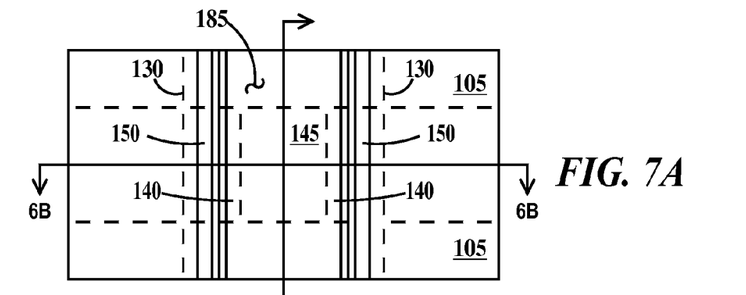
Figure 7B:
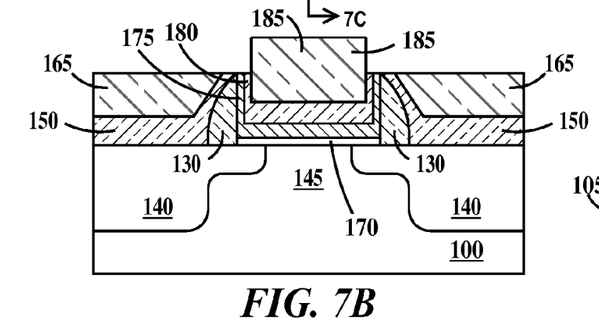
Figure 7C:
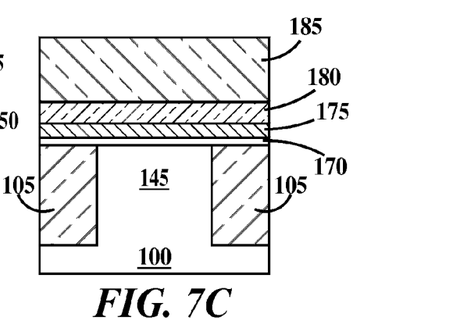

FIG. 7A is a top view, FIG. 7B is a cross-sectional view through line 7B-7B of FIG. 7A and FIG. 7C is a cross-sectional views through line 7B-7B of FIG. 7A. In FIGS. 7A, 7B and 7C, silicon nitride layer 180 and gate conductor layer 175 are removed from top surfaces of silicon dioxide layer 165 and silicon nitride layer 150, for example, by wet or dry etching or a combination of wet and dry etching.

Figure 8A:
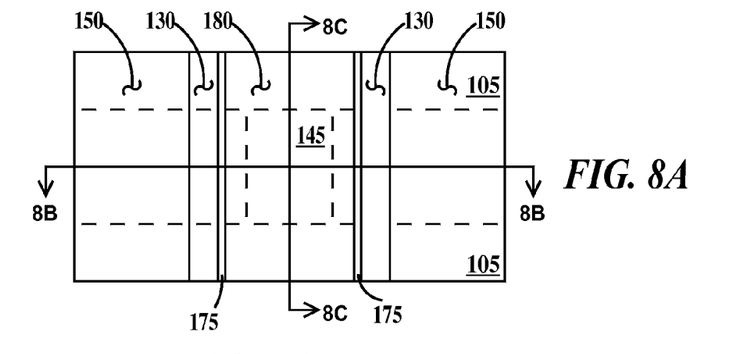
Figure 8B:
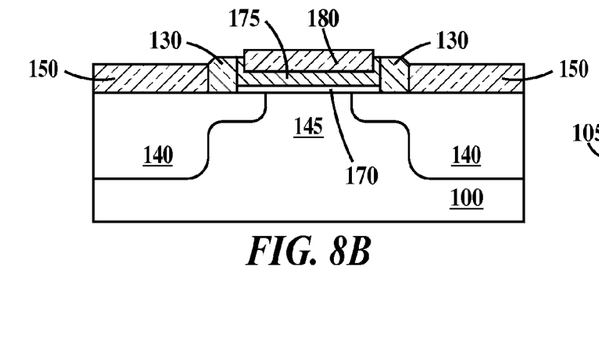
Figure 8C:
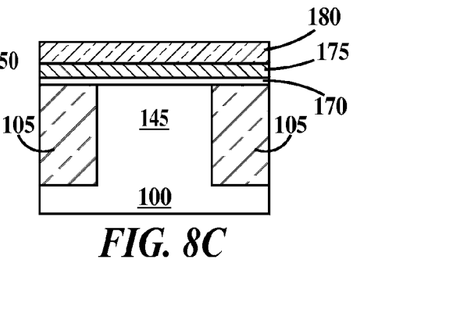

FIG. 8A is a top view, FIG. 8B is a cross-sectional view through line 8B-8B of FIG. 8A and FIG. 8C is a cross-sectional views through line 8C-8C of FIG. 8A. In FIGS. 8A, 8B and 8C, silicon dioxide layer 165, silicon oxide layer 185 and upper portions of silicon nitride layer 150, upper portions of spacers 130 and upper portions of gate conductor layer 175 between spacers 130 and silicon nitride layer 180 are also removed. In one example the removal silicon dioxide layer 165, silicon oxide layer 185 and upper portions of silicon nitride layer 150, spacers 130 and gate conductor layer 175 is by a CMP. Though the top surfaces of silicon nitride layer 180, silicon nitride layer 150, spacers 130 and gate conductor layer 175 are not illustrated in FIG. 8B, as coplanar, they may be coplanar. The point is silicon oxide layers 165 and 185 are completely removed and any vertically projecting regions of nitride layer 150, spacers 130 and gate conductor layer 175 are reduced in height so as not to project above the top surface of silicon nitride layer 180.

Figure 9A:
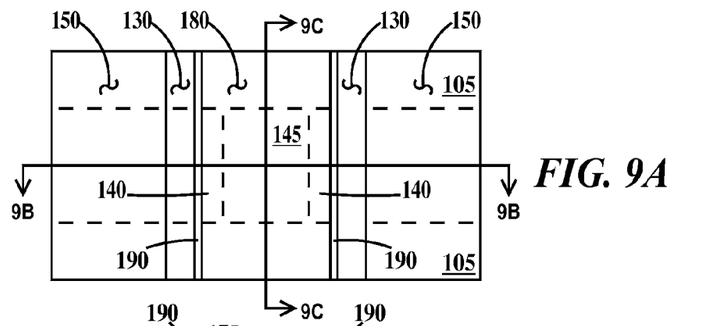
Figure 9B:
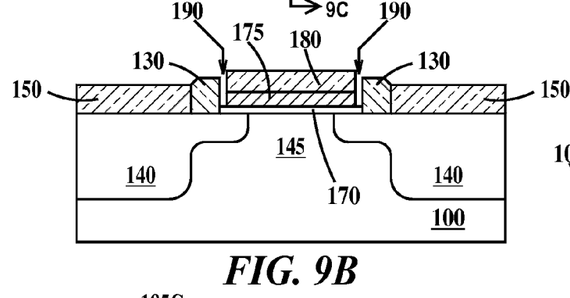
Figure 9C:
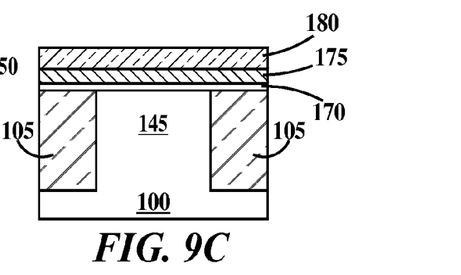

FIG. 9A is a top view, FIG. 9B is a cross-sectional view through line 9B-9B of FIG. 9A and FIG. 9C is a cross-sectional views through line 9B-9B of FIG. 9A. In FIGS. 9A, 9B and 9C, exposed regions of gate conductor layer 175 between spacers 130 and silicon nitride layer 180 are removed (e.g. by RIE) to at least below a bottom surface of silicon nitride layer 180 if not completely to expose gate dielectric layer 170 in the bottom of thus formed trenches 190. Gate conductor layer 175 is now effectively a completed gate electrode 175.

Figure 10A:
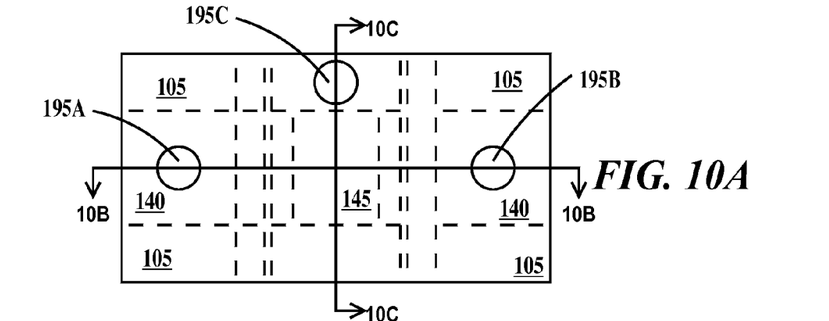
Figure 10B:
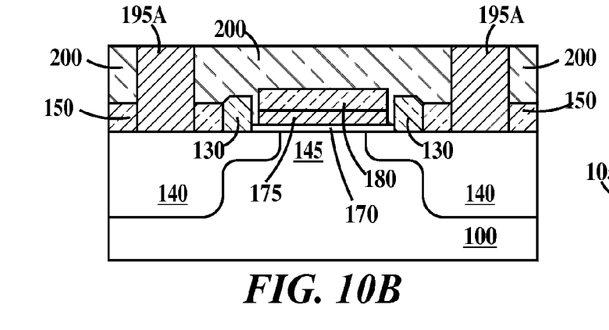
Figure 10C:
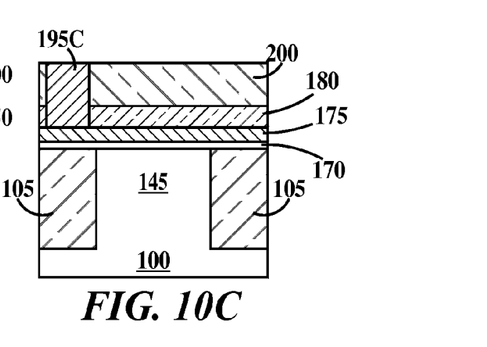

FIG. 10A is a top view, FIG. 10B is a cross-sectional view through line 10B-10B of FIG. 10A and FIG. 10C is a cross-sectional views through line 10C-10C of FIG. 10A. In FIGS. 10A. 10B and 10C, contacts 195A, 195B and 195C are formed in a insulating layer 200 that has been blanket deposited. Contacts 195A and 195B contact source/drains 140 and contact 195C contacts gate electrode layer 175. It should be noted that contact 195C is located completely over STI 105 and does not overlap channel region 145. This further reduces parasitic capacitance. It is possible, however, to form the contact at least partially over channel region 145. Through not shown in FIG. 10B, a metal silicide layer may be formed on the surface of source drains 140 through contact openings in insulating layer 200, which openings are then filled with contacts 195A, 195B and 195C. In one example, contacts 195A, 195B and 195C comprise tungsten. In one example, insulating layer 200 comprises a CVD silicon dioxide. Additional metal wires formed in interlevel dielectric layers (ILDs) are next formed to complete an integrated circuit having one or more transistors, each comprised of respective source/drains 140, channel regions 145, gate dielectrics 170 and gate electrodes 175.

Figure 11A:
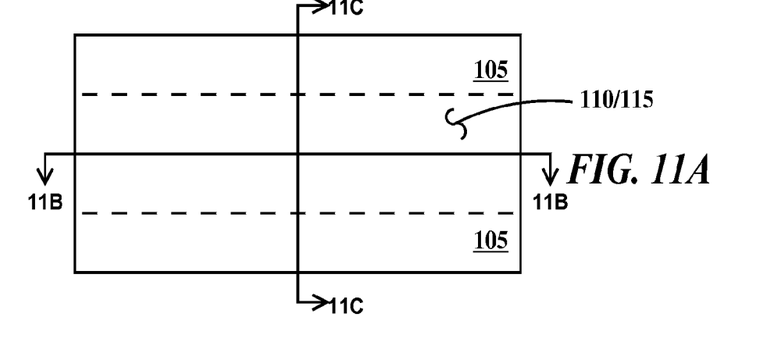
FIGS. 11A/11B/11C through 23A/23B/23C are respectively top views, and front and side cross-sectional views through respective lines 11B-11B and 11C-11C through 23B-23B and 23C-23C illustrating fabrication of a CMOS device according to a second embodiment of the present invention.
Figures 11B, 11C:
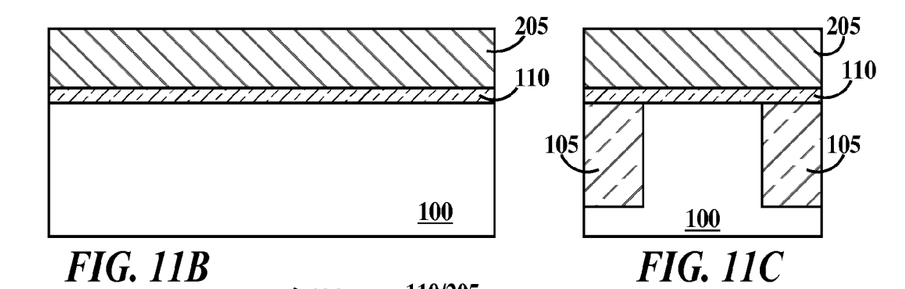

FIGS. 11A/11B/11C through 23A/23B/23C are respectively top views, and front and side cross-sectional views through respective lines 11B-11B and 11C-11C through 23B-23B and 23C-23C illustrating fabrication of a CMOS device according to a second embodiment of the present invention.

FIGS. 11A, 11B, 11C, 12A, 12B, 12C, 13A, 13B, 13C, 14A, 14B and 14C are similar to FIGS. 1A, 1B, 1C, 2A, 2B, 2C, 3A, 3B, 3C, 4A, 4B and 4C respectively except for the replacement of silicon nitride layer 115 with polysilicon layer 205. In one example, polysilicon layer 205 is between about 25 nm and about 200 nm thick. The polysilicon needs to be in this thickness range as wires connected to thin metal or metal alloy gate electrodes will be formed from polysilicon layer 205 as described infra, and resistance of those wires must be minimized.

Figure 15A:
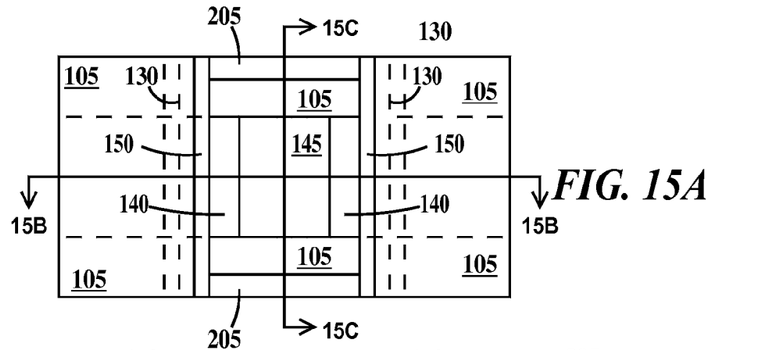
Figure 15B:
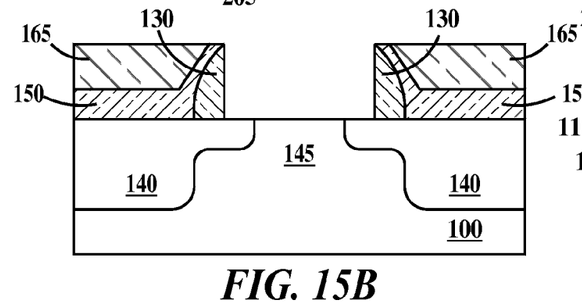
Figure 15C:
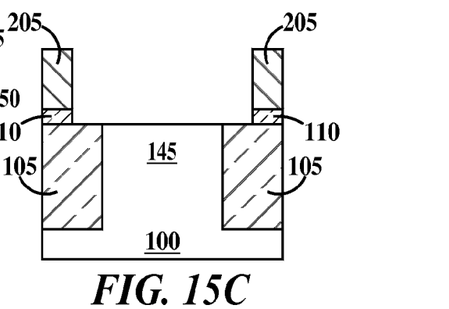

FIG. 15A is a top view, FIG. 15B is a cross-sectional view through line 15B-15B of FIG. 15A and FIG. 15C is a cross-sectional views through line 15C-15C of FIG. 15A. In FIGS. 15A, 15B and 15C polysilicon layer 205 and first pad layer 110 are removed between spacers 130 and from over a portion of STI 105 between spacers 130.

Figure 16A:
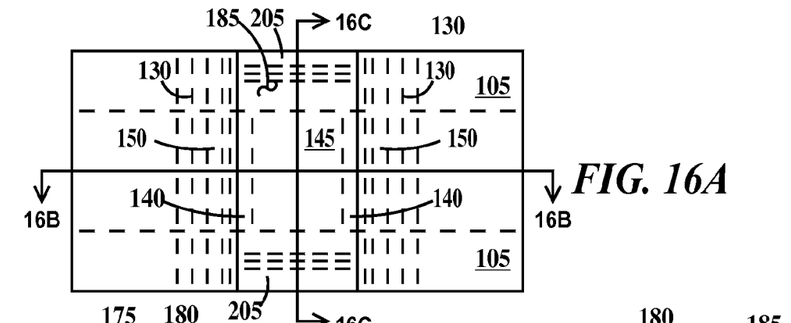
Figure 16B:
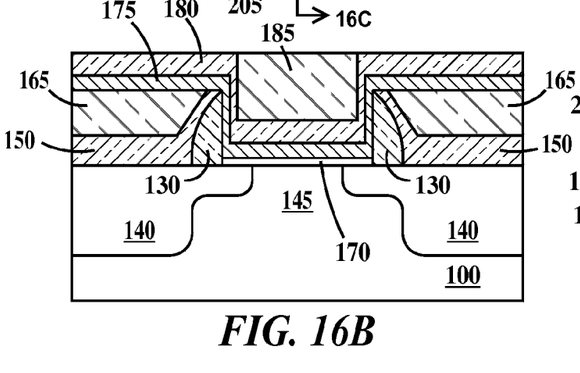
Figure 16C:
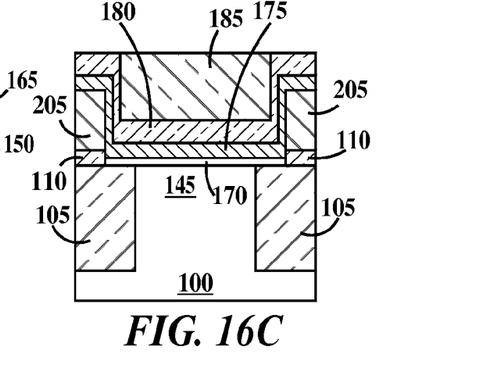

FIG. 16A is a top view, FIG. 16B is a cross-sectional view through line 16B-16B of FIG. 16A and FIG. 16C is a cross-sectional views through line 16B-16B of FIG. 16A. FIGS. 16A, 16B and 16C, are similar to FIGS. 6A, 6B and 6C described supra, except in FIG. 16C, polysilicon layer 205 and first pad layer 110 are present and bound gate conductor layer 175 in the 16C-16C direction.

Figure 17A:
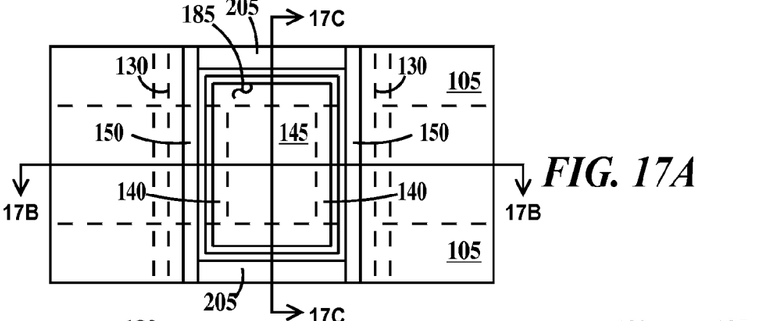
Figure 17B:
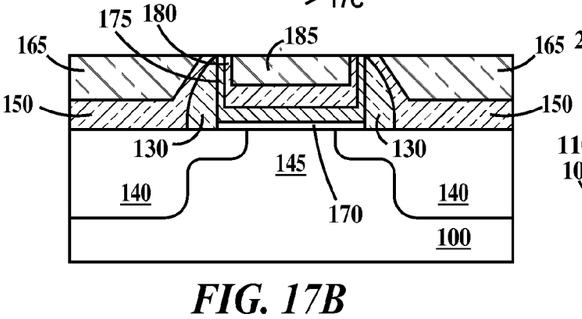
Figure 17C:
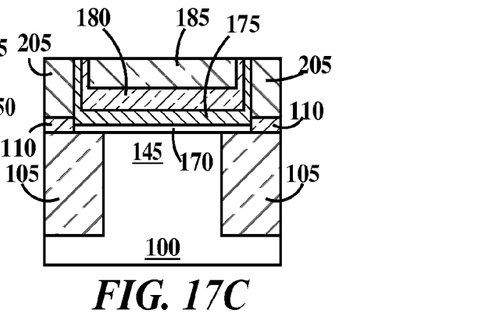

FIG. 17A is a top view, FIG. 17B is a cross-sectional view through line 17B-17B of FIG. 17A and FIG. 17C is a cross-sectional views through line 17C-17C of FIG. 17A. In FIGS. 17A, 17B and 17C, silicon nitride layer 180 and gate conductor layer 175 are removed from top surfaces of silicon dioxide layer 165 and silicon nitride layer 150, for example, by etching or CMP or a combination etching and CMP. Gate conductor layer 175 extends over STI 105. Polysilicon layer 205 does not extend over source/drains 140 or channel region 145.

Figure 18A:
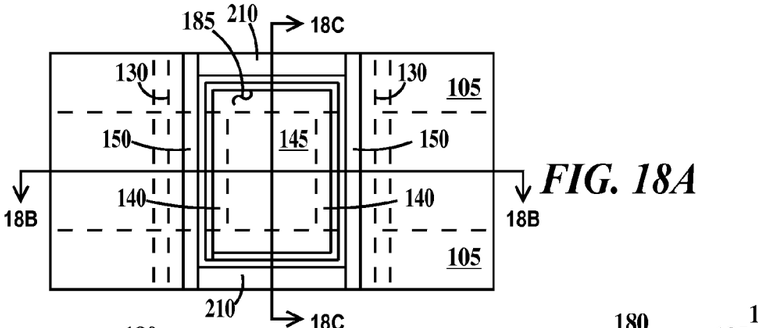
Figure 18B:
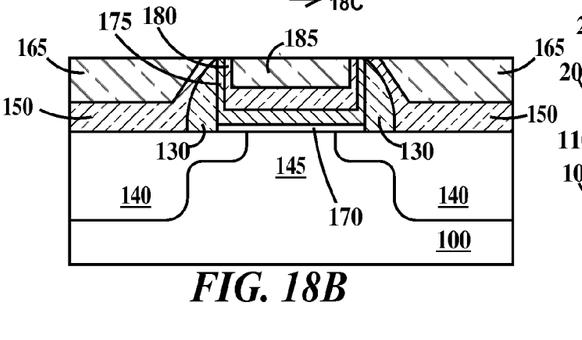
Figure 18C:
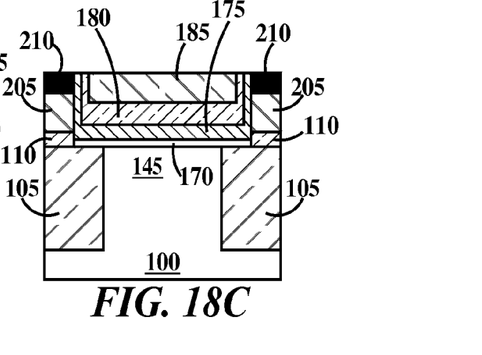

FIG. 18A is a top view, FIG. 18B is a cross-sectional view through line 18B-18B of FIG. 18A and FIG. 18C is a cross-sectional views through line 18C-18C of FIG. 18A. In FIGS. 18A, 18B and 18C, an optional metal silicide layer 210 is formed on all exposed surface of polysilicon layer 205. Metal silicides are formed by deposition of a reactive metal, followed by a heat treatment at a temperature that causes silicon to react with the metal, followed by removal of unreacted metal. Examples of metal silicides include but are not limited to nickel silicide, platinum silicide, titanium silicide and palladium silicide. It is advantageous to utilize certain combinations of gate dielectric and metal silicides for PFETs and NFETs. These silicides are well know in the industry, and are formulated by unique or compound materials that are well known in the periodic table.

Figure 19A:
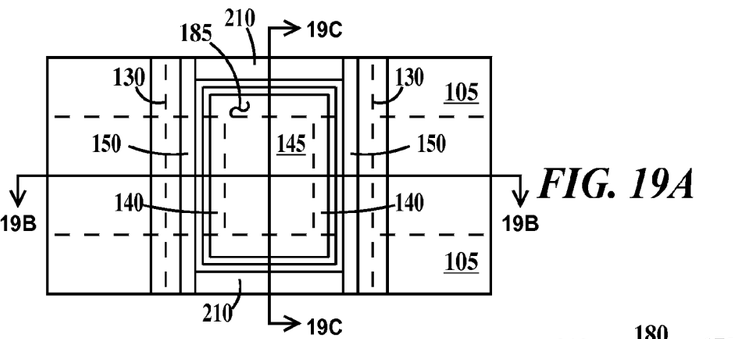
Figure 19B:
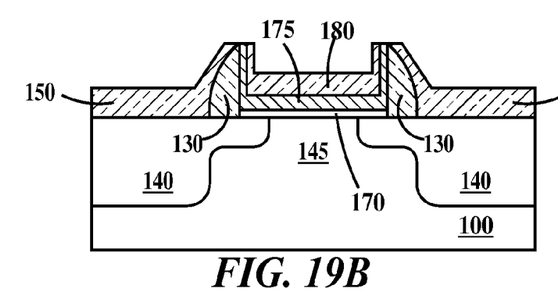
Figure 19C:
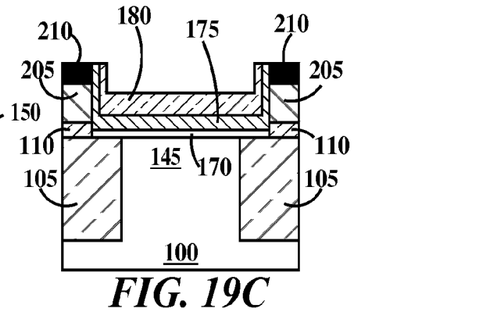

FIG. 19A is a top view, FIG. 19B is a cross-sectional view through line 19B-19B of FIG. 19A and FIG. 19C is a cross-sectional views through line 19B-19B of FIG. 19A. In FIGS. 19A, 19B and 19C, silicon dioxide layer 165 and silicon dioxide layer 185 (see FIG. 18B) are removed by etching.

Figure 20A:
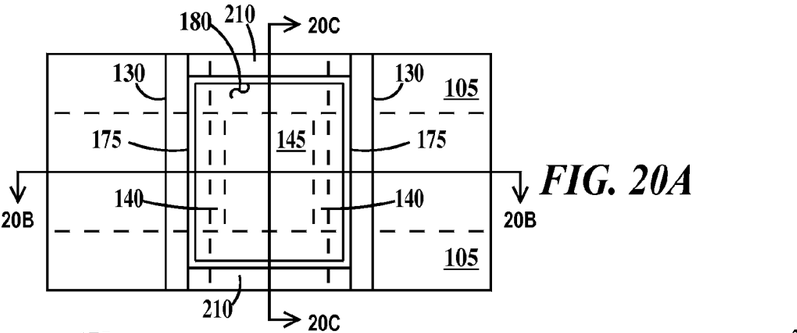
Figure 20B:
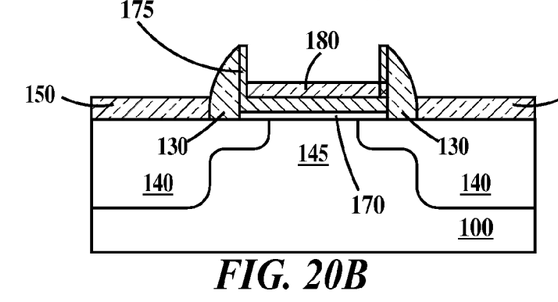
Figure 20C:
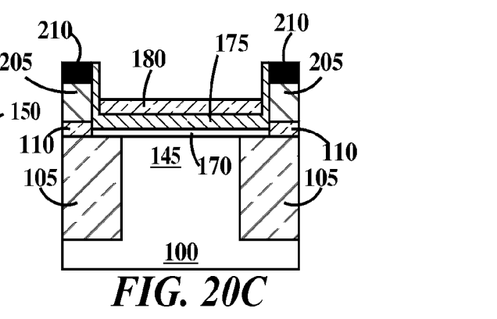

FIG. 20A is a top view, FIG. 20B is a cross-sectional view through line 20B-20B of FIG. 20A and FIG. 20C is a cross-sectional views through line 20C-20C of FIG. 20A. In FIGS. 20A, 20B and 20C, upper portions of silicon nitride layer 150 formed on spacers 130 is removed by etching. Silicon nitride layer 150 on horizontal surfaces is thinned.

Figure 21A:
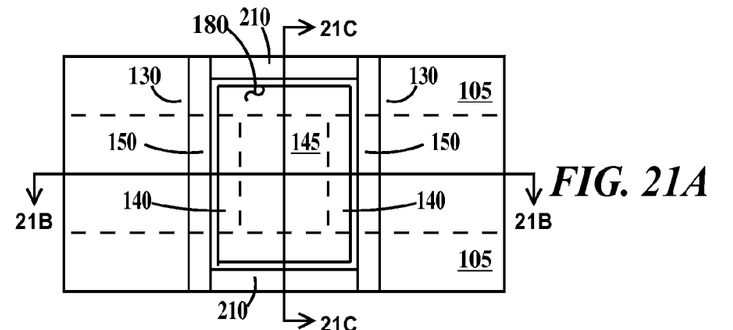
Figure 21B:
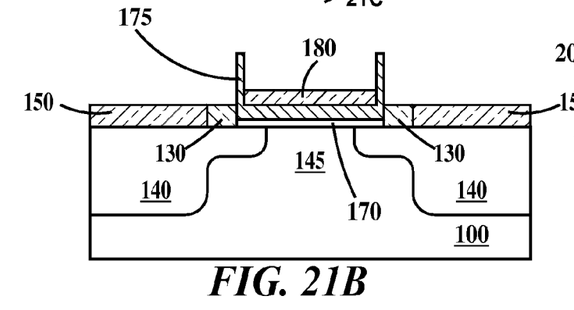
Figure 21C:
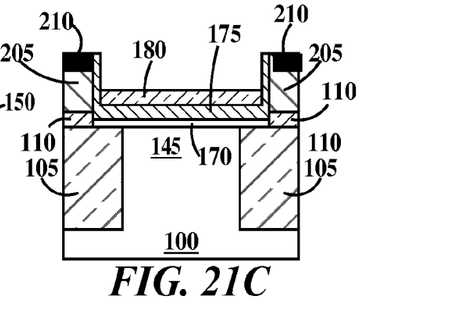

FIG. 21A is a top view, FIG. 21B is a cross-sectional view through line 21B-21B of FIG. 21A and FIG. 21C is a cross-sectional views through line 21C-21C of FIG. 21A. In FIGS. 21A, 21B and 21C, upper portions of spacers 130 that extend above the top surface of silicon nitride layer 150 are removed using a wet or dry etch.

Figure 22A:
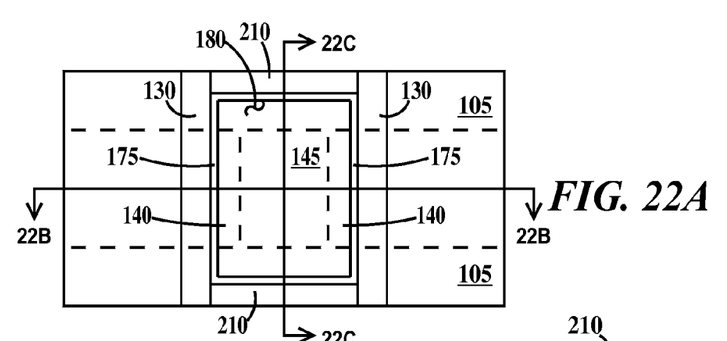
Figure 22B:
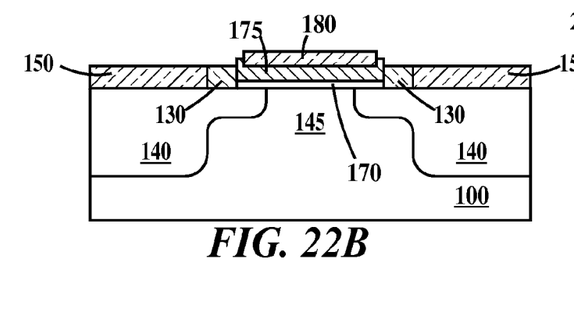
Figure 22C:
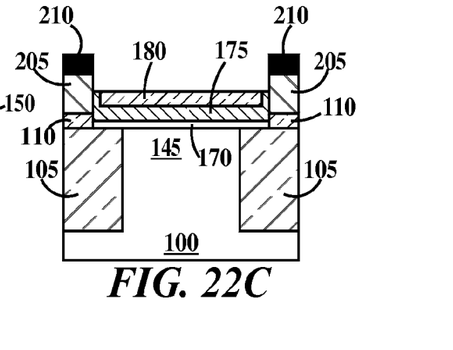

FIG. 22A is a top view, FIG. 22B is a cross-sectional view through line 22B-22B of FIG. 22A and FIG. 22C is a cross-sectional views through line 22C-22C of FIG. 22A. In FIGS. 22A, 22B and 22C, upper portions of gate electrode layer 175 that extend above the top surface of silicon nitride layer 180 are removed using a wet or dry etch.

Figure 23A:
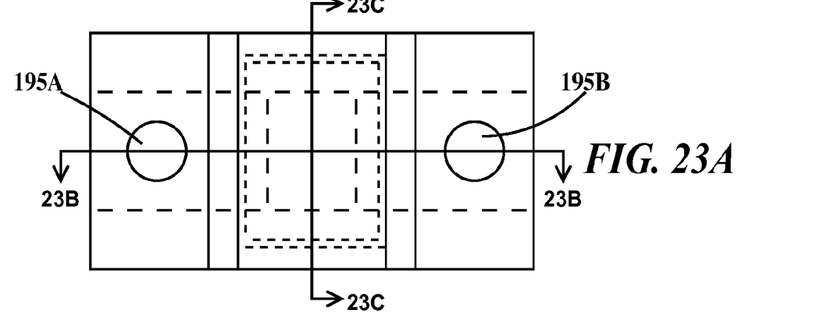
Figure 23B:
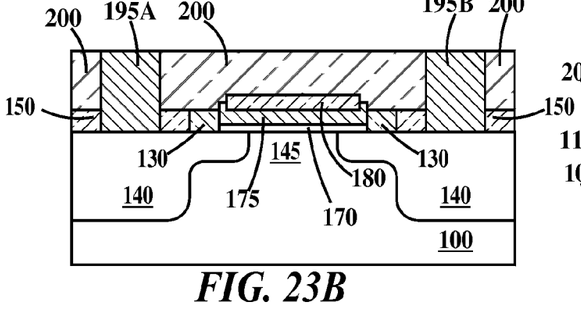
Figure 23C:
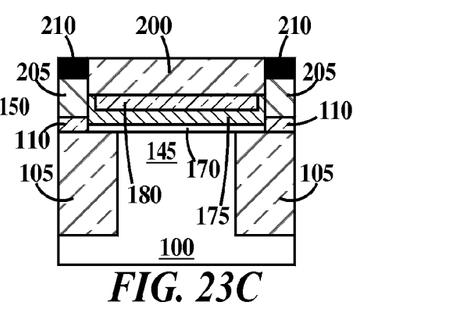

FIG. 23A is a top view, FIG. 23B is a cross-sectional view through line 23B-23B of FIG. 23A and FIG. 23C is a cross-sectional views through line 23C-23C of FIG. 23A. In FIGS. 23A. 23B and 23C, contacts 195A and 195B are formed in insulating layer 200. Contacts 195A and 195B contact source/drains 140. There is no contact per se to gate electrode 175 as contact to gate electrode 175 is from silicide layers 210 to polysilicon layer 205 thence to gate electrode 175. It should be noted that polysilicon layer 205 is located completely over STI 105 and does not overlap channel region 145. This further reduces parasitic capacitance. Through not shown in FIG. 23B, a metal silicide layer may be formed on the surface of source drains 140 through contact openings in insulating layer 200, which opening are then filled with contacts 195A and 195B. Additional metal wires formed in interlevel dielectric layers (ILDs) are next formed to complete an integrated circuit having one or more transistors, each comprised of respective source/drains 140, channel regions 145, gate dielectrics 170 and gate electrodes 175.

Figure 12A:
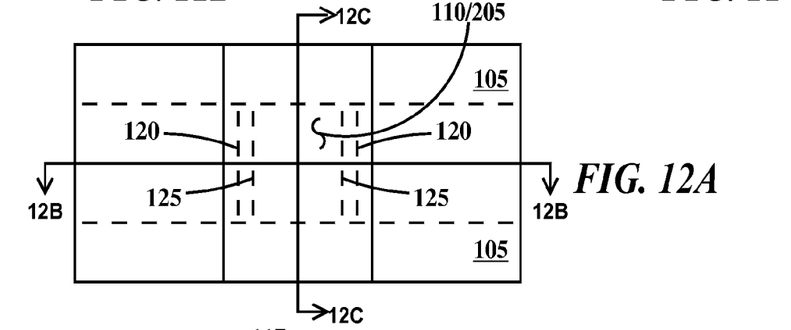
Figure 12B:
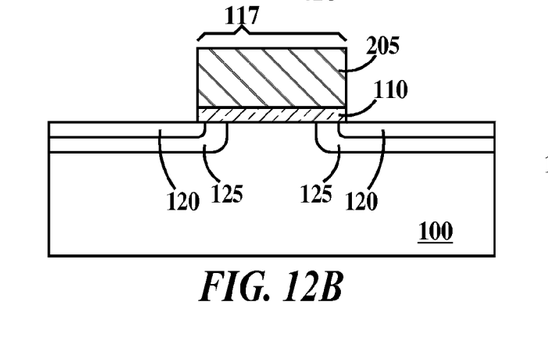
Figure 12C:
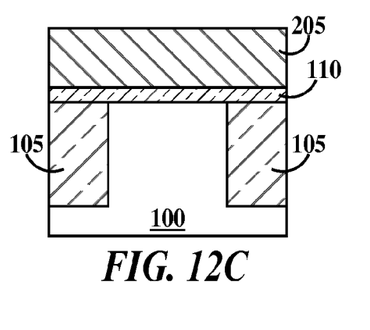
Figure 13A:
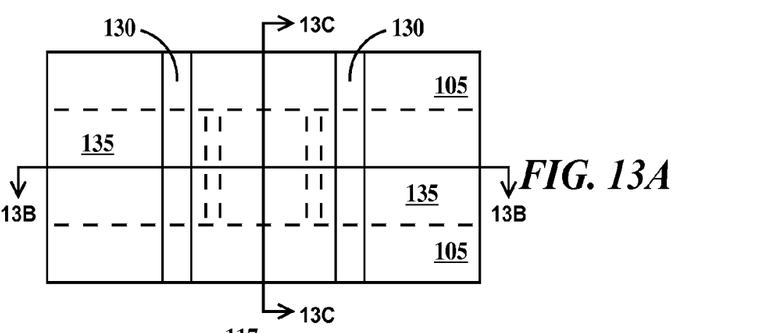
Figure 13B:
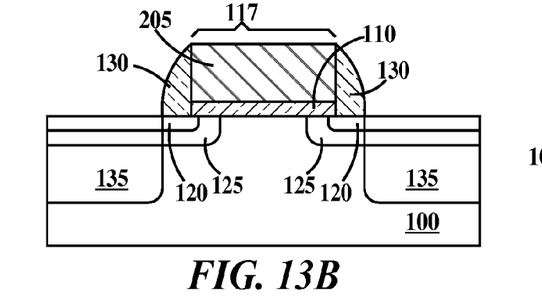
Figure 13C:
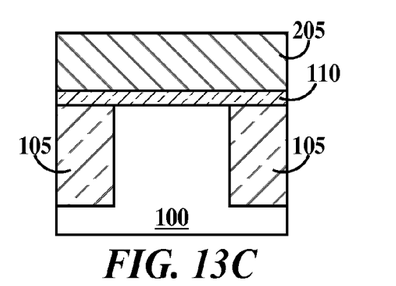
Figure 14A:
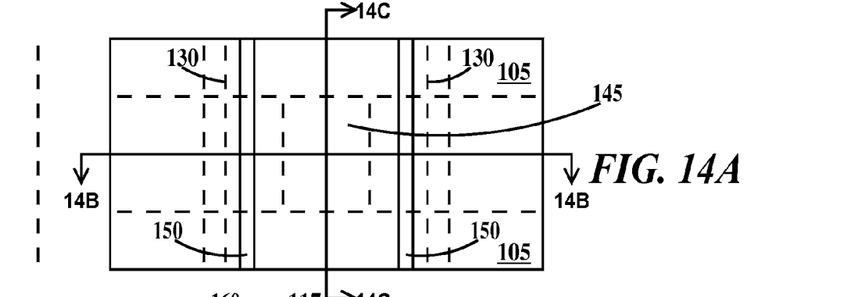
Figure 14B:
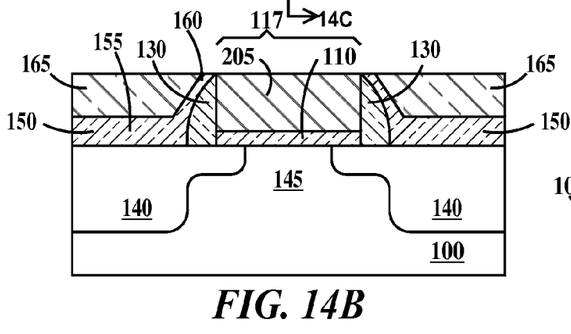
Figure 14C:
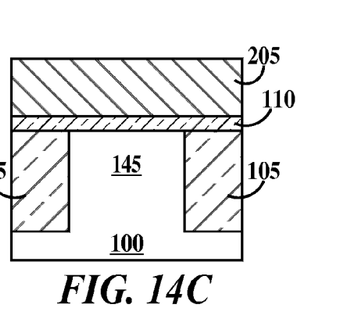

In the second embodiment of the present invention, for specified CMOS devices, layer 110 may be a gate dielectric layer or removed and replaced by a gate dielectric and polysilicon line 117 formed in FIGS. 12A, 12B and 12C may be left in place to form conventional NFETs and PFETs.

In all embodiments of the present invention, regions of the source/drains not abutting the channel region of the FET may abut a continuation of the STI in order to completely isolate the FET, either by formation of a junction abutting the STI a distance into the substrate or by the STI abutting a buried insulating layer (e.g. a buried oxide or BOX layer) of a silicon on insulator (SOI) substrate.

Thus the present invention provides for thin gate electrode CMOS transistors that have significantly lower parasitic capacitance than conventional CMOS transistors.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:

forming a dielectric trench isolation in a semiconductor substrate;

forming a first layer on a top surface of said semiconductor substrate and on a top surface of said trench isolation;

patterning said first layer into a line, and ion implanting a source extension and a drain extension into said substrate on opposite sides of said line, said source and drain extensions separated by a channel region of said substrate under said line;

forming dielectric spacers on opposite sidewalls of said line, said spacers having inner walls abutting said line and outer walls away from said line;

forming a source and a drain in said substrate where said substrate is not protected by said line or said spacers;

forming a second layer over said source, said drain, said trench isolation and said spacers;

removing said line from over said channel region to form a trench defined by said inner walls of said spacers and said top surface of said substrate;

forming a gate dielectric layer on said top surface of said substrate in said channel region;

forming a metal or metal alloy gate electrode on a top surface of said gate dielectric layer and said inner walls of said spacers, said gate electrode extending over said trench isolation, said gate electrode and said gate dielectric layer not filling said trench;

forming a dielectric third layer on a top surface of said gate electrode, said gate electrode and said third layer not filling said trench;

forming a dielectric fourth layer on said top surface of said third layer, said fourth layer filling remaining space in said trench;

performing a planarization process to coplanarize a top surface of said third and fourth layers;

wherein said first layer is a dielectric layer and said second layer comprises a second upper layer and a second lower layer;

removing portions of said second upper and lower layers, said dielectric spacers, said gate electrode and said dielectric third layer so a top surface of said dielectric fourth layer is raised above top surfaces of said second upper and lower layers, said dielectric spacers, said gate electrode and said dielectric third layer.

2. The method of claim 1, wherein said first layer comprises a dielectric first upper layer on a top surface of a dielectric first lower layer and wherein said second layer comprises a dielectric second upper layer on a top surface of a dielectric second lower layer, a bottom surface of said first lower layer on said top surfaces of said substrate and said trench isolation, a top surface of said second upper layer coplanar with a top surface of said first upper layer and regions of said top surface of said second lower layer adjacent to said spacers, regions of said second lower layer intervening between said first and second upper layers.

3. The method of claim 1, further including:

forming a dielectric fifth layer on said first lower layer of said second layer, said spacers and said third layer;

forming an electrically conductive first contact to said source, forming an electrically conductive second contact to said drain and forming an electrically conductive third contact to said gate electrode, said first and second contacts extending respectively from a top surface of said fifth layer to said source and said drain, said third contact extending from said top surface of said fifth layer though said second lower region of said second layer to said gate electrode, said third contact completely over said trench isolation; and top surfaces of said first, second and third contacts coplanar with said top surface of said fifth layer.

4. The method of claim 1, wherein said gate electrode extends over a first region of trench isolation and wherein said line comprises a polysilicon layer on top of an insulating layer, said line extends over a second and adjacent region of said trench isolation, and wherein regions of said polysilicon line are in physical and electrical contact with said gate electrode.

5. The method of claim 4, further including:

forming a dielectric fifth layer on said first lower layer of said second layer, said spacers and said third layer;

forming an electrically conductive first contact to said source and forming an electrically conductive second contact to said drain, said first and second contacts extending respectively from a top surface of said dielectric layer though said second lower region of said second layer to said source and said drain; and coplanarizing top surfaces of said first and second contacts and said polysilicon line.

6. The method of claim 4, further including:

forming a metal silicide layer on a top surface of said polysilicon layer of said line;

forming a dielectric fifth layer on said first lower layer of said second layer, said spacers and third layer;

forming an electrically conductive first contact to said source and forming an electrically conductive second contact to said drain, said first and second contacts extending respectively from a top surface of said dielectric layer though said second lower region of said second layer to said source and said drain; and coplanarizing top surfaces of said first and second contacts and said metal silicide layer.

7. The method of claim 1, wherein said gate dielectric is a high dielectric constant material having a relative permittivity above about 10.

8. The method of claim 1, wherein said gate electrode comprises tungsten, titanium, tantalum, or aluminum, an electrically conductive metallic nitride, an electrically conductive metallic silicide or combinations thereof.

9. The method of claim 1, wherein said gate electrode has a thickness of about 25 nm or less.

10. The method of claim 1, wherein said line extends over said channel region and said trench isolation.

11. The method of claim 1, wherein said source/drain extension regions extend under said line.

12. The method of claim 1, wherein top surfaces of said spacers are proximate to a top surface of said line.

13. The method of claim 1, wherein said top surface of said substrate and said top surface of said trench isolation are coplanar.

14. The method of claim 1, wherein said metal layer is thicker on said gate dielectric layer in a direction perpendicular to said top surface of said substrate than on said inner walls of said spacers in a direction perpendicular to said inner walls.

15. The method of claim 1, wherein said first layer comprises a polysilicon first upper layer on a top surface of a dielectric first lower layer and wherein said second layer comprises a dielectric second upper layer on a top surface of a dielectric second lower layer, a top surface of said second upper layer coplanar with a top surface of said first upper layer and regions of said top surface of said second lower layer adjacent to said spacers, regions of said second lower layer intervening between said first and second upper layers.

* * * * *